US009755579B1

(12) United States Patent
Ahmed et al.

(10) Patent No.: US 9,755,579 B1
(45) Date of Patent: Sep. 5, 2017

(54) AMPLIFIER DEVICES WITH ENVELOPE SIGNAL SHAPING FOR GATE BIAS MODULATION

(71) Applicant: NXP USA INC., Austin, TX (US)

(72) Inventors: Abdulrhman M. S. Ahmed, Gilbert, AZ (US); Joseph Staudinger, Gilbert, AZ (US)

(73) Assignee: NXP USA, INC., Austin, TX (US)

( * ) Notice: Subject to any disclaimer, the term of this patent is extended or adjusted under 35 U.S.C. 154(b) by 0 days.

(21) Appl. No.: 15/374,803

(22) Filed: Dec. 9, 2016

(51) Int. Cl.
| H04B 1/16 | (2006.01) |
| H03F 1/02 | (2006.01) |
| H04L 27/22 | (2006.01) |
| H04L 25/03 | (2006.01) |
| H01C 1/16 | (2006.01) |
| H03F 3/193 | (2006.01) |
| H03F 3/21 | (2006.01) |
| H03G 1/00 | (2006.01) |

(52) U.S. Cl.
CPC ............. *H03F 1/0288* (2013.01); *H01C 1/16* (2013.01); *H03F 3/193* (2013.01); *H03F 3/21* (2013.01); *H03G 1/0088* (2013.01); *H04B 1/16* (2013.01); *H04L 25/03* (2013.01); *H04L 27/22* (2013.01); *H03F 2200/102* (2013.01); *H03F 2200/18* (2013.01); *H03F 2200/451* (2013.01); *H03G 2201/106* (2013.01)

(58) Field of Classification Search
CPC .......... H03F 1/0288; H03F 3/193; H03F 3/21; H01C 1/16; H04L 25/03; H04L 27/22; H04B 1/16
USPC ........................................................ 455/205
See application file for complete search history.

(56) References Cited

U.S. PATENT DOCUMENTS

| 6,788,151 | B2 * | 9/2004 | Shvarts ................... H03F 1/025 330/127 |
| 2004/0041627 | A1 * | 3/2004 | Kim ...................... H03F 1/0288 330/124 R |
| 2007/0105517 | A1 * | 5/2007 | Chang .................. H03G 1/0088 455/249.1 |
| 2009/0302941 | A1 | 12/2009 | Wimpenny |
| 2013/0207731 | A1 | 8/2013 | Balteanu |
| 2014/0028392 | A1 | 1/2014 | Wimpenny |
| 2015/0236652 | A1 | 8/2015 | Yang et al. |
| 2015/0318827 | A1 * | 11/2015 | Srinidhi Embar ........ H03F 3/21 330/295 |

* cited by examiner

*Primary Examiner* — Sanh Phu

(57) ABSTRACT

The embodiments described herein include amplifiers configured for use in radio frequency (RF) applications. In accordance with these embodiments, the amplifiers are implemented to generate a shaped envelope signal, and to apply the shaped envelope signal to transistor gate(s) of the amplifier to provide gate bias modulation. So configured, the shaped envelope signal may facilitate high linearity in the amplifier.

20 Claims, 5 Drawing Sheets

AMPLIFIER DEVICES WITH ENVELOPE SIGNAL SHAPING FOR GATE BIAS MODULATION

TECHNICAL FIELD

Embodiments of the subject matter described herein relate generally to amplifiers, and more particularly to radio frequency (RF) power amplifiers used in a variety of applications.

BACKGROUND

In general, amplifiers are used to increase the power of signals. For example, amplifiers can be used to convert low-power radio frequency (RF) signals into larger RF signals for driving the antenna of a transmitter. In such cases, amplifiers may be implemented as part of an overall power amplifier used by an RF transmission system.

Power amplifiers tend to consume a significant portion of the total power consumed by a transmission system. Therefore, the power amplifier's efficiency (i.e., the output power of the amplifier divided by the total DC power supplied to the amplifier) is an amplifier quality that designers consistently strive to increase.

However, amplifier bandwidth and linearity are also important parameters to consider, and many amplifier designs with high theoretical power efficiencies may have characteristically lower fractional bandwidths and reduced linearity. Therefore, there remains a need for amplifiers that provide both relatively high efficiency, relatively high fractional bandwidth, and high linearity.

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures.

DETAILED DESCRIPTION

The embodiments described herein include amplifiers that are commonly used in radio frequency (RF) applications. In these embodiments, the amplifiers are configured to use gate bias modulation in a way that can facilitate improved amplifier performance. Specifically, the amplifiers can be implemented to use a shaped envelope signal, where the shaped envelope signal is applied to transistor gate(s) of the amplifier to provide gate bias modulation. So configured, the shaped envelope signal can facilitate an amplifier with relatively high performance, including relatively high power efficiency and linearity.

In various embodiments attenuators and/or phase shifters can be used to shape the envelope signal that is used for gate bias modulation. In such embodiments, the attenuators and/or phase shifters can shape the envelope signal in the analog domain, and in a way that can facilitate the improved amplifier efficiency with relatively low device complexity. Furthermore, the attenuators and/or phase shifters can be digitally controlled to facilitate relatively high adaptability.

Figure 1:
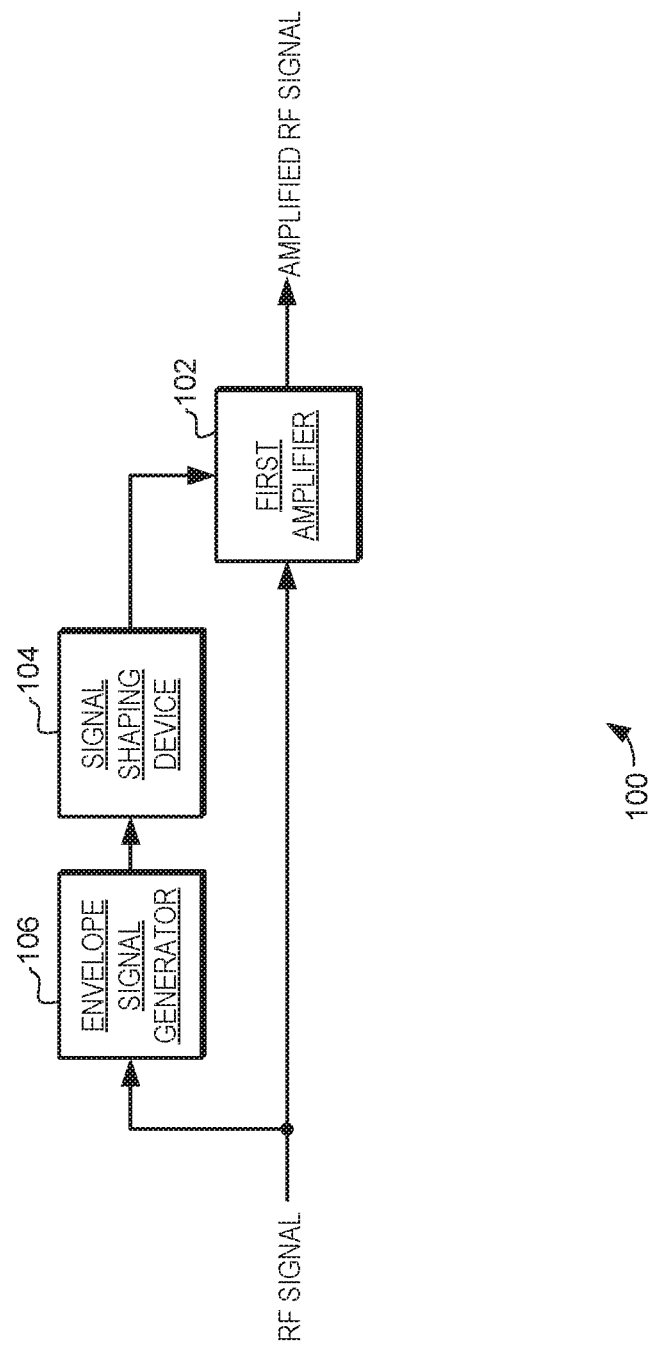
FIG. 1 is a schematic diagram of a portion of an amplifier in accordance with an example embodiment.

Turning now to FIG. 1, a schematic diagram of a portion of an exemplary amplifier device 100 is illustrated. The amplifier device 100 includes a first amplifier 102 (including one or more first transistors), a signal shaping device 104, and an envelope signal generator 106. It should be noted that amplifier device 100 is a very simplified representation of a portion of an amplifier, and in a more typical implementation the amplifier device 100 would include additional features not illustrated in FIG. 1.

The first amplifier 102 receives an RF signal and outputs an amplified RF signal. The envelope signal generator 106 also receives the RF signal, and generates an envelope signal corresponding to the RF signal. In general, the generated envelope signal is a lower frequency signal that tracks the amplitude of the envelope of the RF signal. Typically, the envelope signal is thus a smooth curve signal that approximates and outlines the extremes of the RF signal, with the envelope signal increasing as the amplitude of the envelope of an RF signal increases, and decreasing as the amplitude of the envelope of the RF signal decreases. In such an embodiment, the envelope signal generator 106 could be implemented with digital signal processor (DSP) or any other suitable device and with any suitable technique.

The generated envelope signal is passed to the signal shaping device 104. In general, the signal shaping device 104 is configured to selectively shape the envelope signal in a way that facilitates improved amplifier efficiency.

In some embodiments, the signal shaping device 104 uses one or more attenuators to selectively shape the envelope signal. In other embodiments, the signal shaping device 104 uses one or more phase shifters to selectively shape the envelope signal. The selectively shaped envelope signal is then applied to the gates of one or more transistors in first amplifier 102.

When applied to the gate(s) of the transistor(s), the selectively shaped envelope signal provides bias modulation to the transistor(s) in the first amplifier 102. The bias modulation provided by the shaped envelope signal can be configured to facilitate the transistor(s) operating at optimal linearity and efficiency during increases and decreases in the RF signal envelope. Thus, in such embodiments the attenuators and/or phase shifters can shape the envelope signal in a way that facilitates improved amplifier efficiency. Additionally, such embodiments can provide this efficiency with relatively low complexity and cost.

In some embodiments the signal shaping device 104 is digitally controlled. For example, the signal shaping device 104 can include digitally controlled attenuators and/or digitally controlled phase shifters. The use of digital control for the signal shaping device 104 can provide increased flexibility. For example, the digital control can facilitate the use of signal shaping to compensate for environmental and operational conditions. For example, the digital control can be used to configure the signal shaping to compensate for changes in ambient temperature. As another example, the digital control can be used to configure the signal shaping to compensate for changes in power requirements resulting from traffic loading. As another example, the digital control can be used to configure the signal shaping to improve efficiency, linearity, and/or peak power.

The digital control of the signal shaping device 104 can be implemented in a variety of ways. For example, the digital control can be implemented with control values that are stored and are used to control the level of attenuation and phase shift applied. As one example, these control values can be determined during set up of the amplifier device 100. As other examples, these control values can be determined during operation. As one detailed example, the control values can be periodically updated at specific intervals or in response to specific events.

As one example, the digital control of the signal shaping device 104 can be implemented to selectively determine the amount or level of attenuation and/or phase shift applied based on the characteristics of the envelope signal. As one example, relatively higher levels of attenuation and/or phase shift can be applied to envelope signals having relatively low amplitudes, while relatively lower levels of attenuation and/or phase shift can be applied to envelope signals having relatively high amplitudes. Such a technique can facilitate efficient transistor operation during periods at which the first amplifier 102 receives relatively low amplitude RF signals by lowering the conduction angle of the transistor(s) in the first amplifier 102. Conversely, applying reduced attenuation during periods at which the first amplifier 102 receives RF signals with relatively high amplitudes allows for higher conduction angles to facilitate higher output power during periods in which relatively high RF signals are received.

As one specific example, the signal shaping device 104 can be configured to attenuate the envelope signal at a first attenuation level for envelope signals having amplitudes below a first threshold and to attenuate the envelope signal to a second attenuation level for envelope signals having amplitudes above the first threshold. As another example, the signal shaping device 104 can be configured to phase shift the envelope signal at a first phase shift level for envelope signals having amplitudes below a first threshold and to phase shift the envelope signal to a second phase shift level for envelope signals having amplitudes above the first threshold.

Furthermore, it should be noted that in typical embodiments the amplifier device 100 may be packaged into a semiconductor device package, where the term "package" means a collection of structural components (e.g., including a flange or substrate) to which the primary electrical components (e.g., input and output leads, first amplifier 102, signal shaping device 104, envelope signal generator 106 and various electrical interconnections) are coupled, and where a "package" is a distinct device that may be coupled to a printed circuit board (PCB) or other substrate that includes other portions of the amplifier.

In such an embodiment the signal shaping device 104 can be co-located in the package with the first amplifier 102. This allows the shaping of the envelope signal for bias modulation without requiring a digital interface from outside the package, and thus can avoid the complication and expense of providing such an active digital interface during operation of the amplifier device 100.

Figure 2:
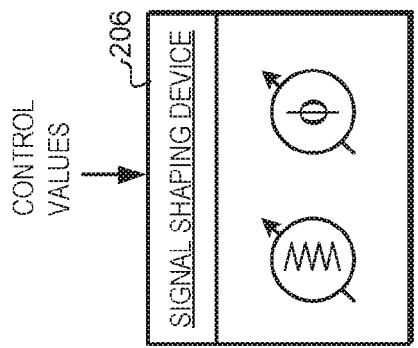
FIG. 2 are schematic diagrams of signal shaping devices in accordance with several example embodiments.
Figure 2:
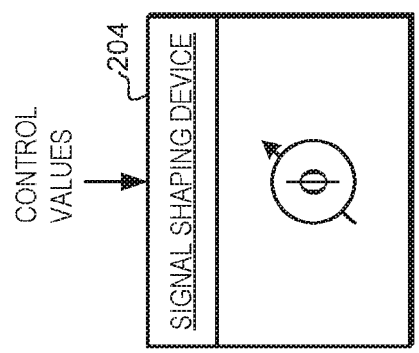
Figure 2:
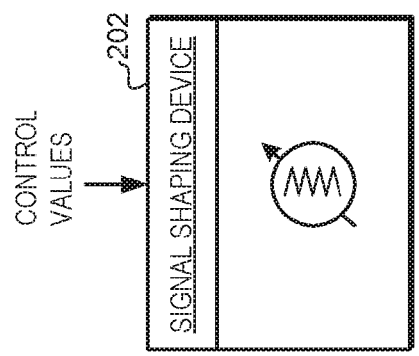

Turning now to FIG. 2, schematic diagrams of three exemplary signal shaping devices are illustrated. Specifically, FIG. 2 illustrates a signal shaping device 202 that includes at least one attenuator. So implemented, the signal shaping device 202 can selectively attenuate an applied signal. Likewise, signal shaping device 204 includes at least one phase shifter. So implemented, the signal shaping device 204 can selectively phase shift an applied signal. Finally, signal shaping device 206 includes at least one attenuator and at least one phase shifter. So implemented, the signal shaping device 206 can selectively attenuate and/or phase shift an applied signal. In each case the signal shaping devices include controllable attenuators and/or phase shifters that can be used to provide signal shaping of an envelope signal based. Furthermore, such devices can be used to provide signal shaping of an RF signal. An example of signal shaping additionally being applied to the RF signal will be discussed below with reference to FIG. 3.

In each of these embodiments of FIG. 2 the attenuation and/or phase shift can be controlled with digital control values. As one example, default control values can be determined during a factory calibration for individual amplifier devices and those control values can be stored in a non-volatile memory (NVM) such as a look up table (LUT) on a digital control device. In this case the digital control values can be stored within the same package as the signal shaping device and associated amplifier(s), or within a separate package or on the PCB to which the amplifier device is coupled. In one embodiment, the control values can provide a default setting for power up of the amplifier device. Additional flexibility can then be provided by updating the control values based on configuration, environmental and/or operational parameters. Additionally, device feedback can be used to determine the control values.

The signal shaping devices 202, 204, and 206 can be implemented with a variety of devices and structures. For example, attenuators can be implemented with a plurality of switched resistors. As detailed examples, the switched resistors could be implemented in a T configuration, Pi configuration, or a bridge T configuration. Likewise, the phase shifters could be implemented with a plurality of switched delay elements that can provide a selectable amount of phase shifting.

Figure 3:
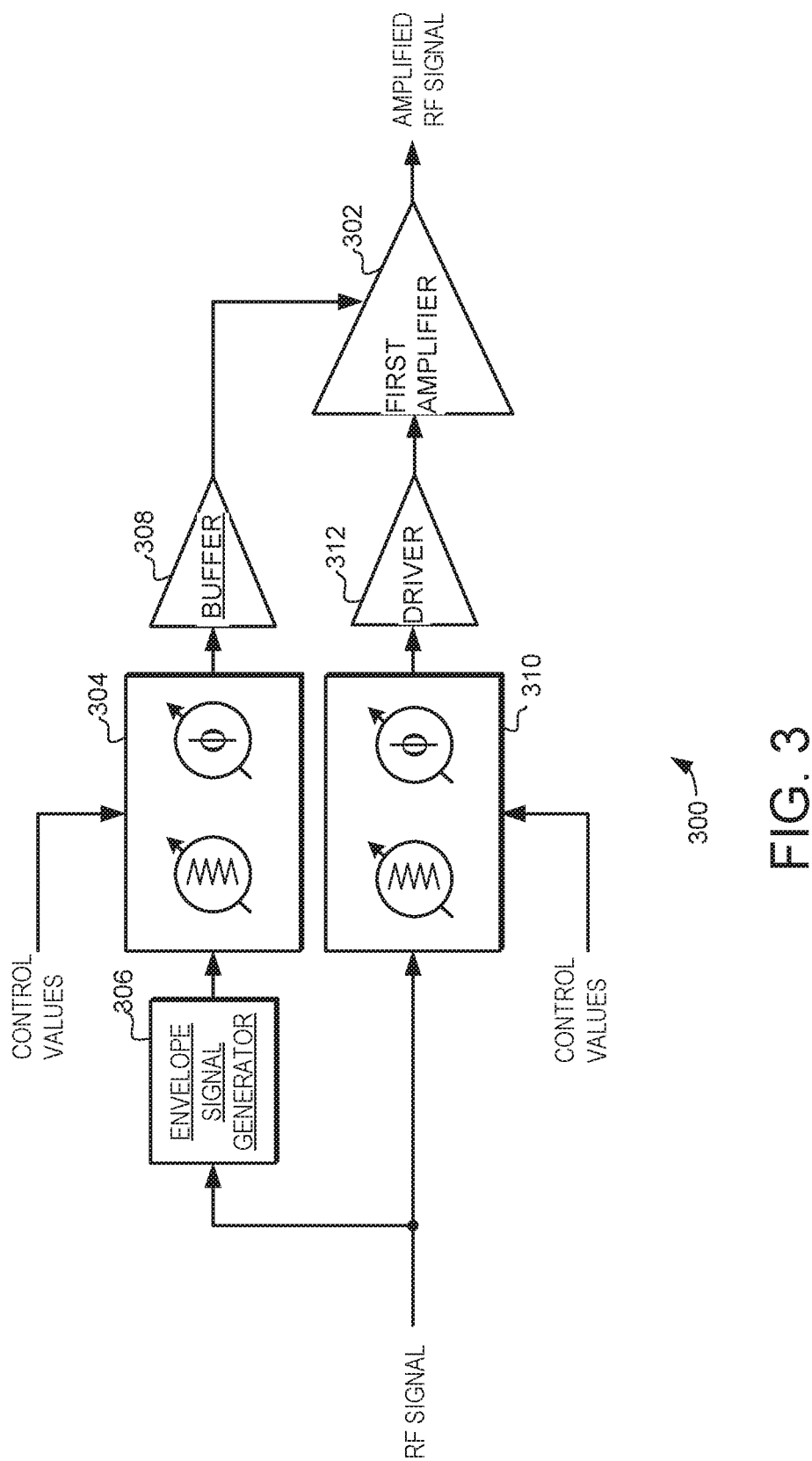
FIG. 3 is a schematic diagram of a portion of an amplifier in accordance with an example embodiment.

Turning now to FIG. 3, a schematic diagram of a portion of an exemplary amplifier device 300 is illustrated. The amplifier device 300 includes a first amplifier 302 (including one or more first transistors), an envelope signal shaping device 304, an envelope signal generator 306, a buffer amplifier 308, an RF signal shaping device 310, and a driver amplifier 312. It should again be noted that amplifier device 300 is again a simplified representation of a portion of an amplifier, and in a typical implementation the amplifier device 300 could include more, fewer, and/or additional features than those illustrated in FIG. 3.

The envelope signal generator 306 receives an RF signal, and generates an envelope signal corresponding to the RF signal. The generated envelope signal is passed to the envelope signal shaping device 304, which shapes the envelope signal to generate a shaped envelope signal (i.e., an envelope signal that has a different amplitude and/or phase than the envelope signal received from the envelope signal generator 306). The shaped envelope signal is outputted to the buffer amplifier 308. The buffer amplifier 308 potentially amplifies and delays the shaped envelope signal so that the shaped envelope signal output from the buffer amplifier 308 is time-aligned with the RF signal being amplified by the first amplifier 302. The shaped envelope signal is applied to the gates of one or more transistors in the first amplifier 302. Thus, the shaped envelope signal is used for gate bias modulation in the first amplifier 302.

The RF signal is also passed to the RF signal shaping device 310, which generates a shaped RF signal. The shaped RF signal is output to the driver amplifier 312, which provides a relatively low amount of amplification to the shaped RF signal. The driver amplifier 312 outputs the preliminarily amplified RF signal to the first amplifier 302, and the first amplifier 302 provides a relatively high amount of amplification to the RF signal, and outputs an amplified RF signal. In an alternate embodiment, the driver amplifier 312 may be excluded from the system (i.e., the system may include a single stage amplifier).

The buffer amplifier 308 is implemented to drive the shaped RF signal to the gate(s) of the transistors in the first amplifier 302. For example, a fixed gain baseband amplifier can be implemented as the buffer amplifier 308. Likewise, the driver amplifier 312 is implemented to drive the RF signals inputted to the first amplifier 302. Typically, the driver amplifier 312 is implemented to drive the RF signals to have amplitudes that facilitate efficient operation of the first amplifier 302.

As described above, the envelope signal generator 306 receives the RF signal and generates an envelope signal corresponding to the RF signal. As one example, the envelope signal generator 306 could be implemented with digital signal processor (DSP). In such an embodiment, the DSP generates the envelope signal using any suitable digital processing technique.

In this illustrated embodiment, the envelope signal shaping device 304 includes one or more attenuators and one or more phase shifters to selectively shape the envelope signal. Likewise, the RF signal shaping device 310 includes one or more attenuators and one or more phase shifters to selectively shape the RF signal.

As was described above, the selectively shaped envelope signal is used for bias modulation of one or more transistors in the first amplifier 302. The selectively shaped RF signal facilitates further control of the amplifier device 300. Specifically, the shaping of the RF signal can be used to change the gate voltage of transistors in the first amplifier 302 in a way that improves the linearity of the amplifier device 300.

The envelope signal shaping device 304 and RF signal shaping device 310 are digitally controlled using sets of control values. These control values can be used to control the timing and amount of attenuation and phase shift provided by the envelope signal shaping device 304 and the RF signal shaping device 310.

As one example, the digital control of the envelope signal shaping device 304 and RF signal shaping device 310 can be implemented to selectively determine the amount or level of attenuation and/or phase shift applied based on the characteristics of the envelope and RF signals. As one example, relatively higher levels of attenuation and/or phase shift can be applied to envelope and RF signals having relatively low amplitudes, while relatively low levels of attenuation and/or phase shift are be applied to envelope and RF signals having relatively high amplitudes. In such an example the envelope signal shaping device 304 and the RF signal shaping device 310 can be implemented to attenuate and phase shift corresponding portions of the envelope and RF signals similarly, such that each corresponding portion of the envelope signal and RF signal are attenuated and phase shifted in a synchronized manner and in the same ways. In other embodiments, the envelope signal shaping device 304 and the RF signal shaping device 310 can be implemented to attenuate and phase shift their respective signals independently. In such an embodiment the envelope signal can be attenuated and phase shifted out of synchronicity with and in different ways from the attenuation and phase shifts applied to corresponding portions of the RF signal.

As an example, the envelope signal shaping device 304 and the RF signal shaping device 310 can be implemented to adjust the amplitude and phase of the RF signal independently from the adjustment of the amplitude and phase of the envelope signal. As a specific example, such an independent adjustment can be used shape the RF signal in a way that compensates for changes in the AM/AM and AM/PM characteristics that result from the shaping of the envelope signal.

As another example, the shaping of the RF signal provided by RF signal shaping device 310 can be implemented to compensate for part-to-part variation in the driver amplifier 312 and/or other elements in the amplifier device 300. As a third example, the shaping of the RF signal provided by RF signal shaping device 310 can be implemented to optimize performance of the first amplifier 302 when operated under the gate bias provided by the shaped envelope signal.

As noted above, the envelope signal shaping device 304 and RF signal shaping device 310 are digitally controlled using sets of control values. For example, the operation of the envelope signal shaping device 304 and RF signal shaping device 310 can be controlled by setting appropriate control values in one or more look up tables (LUT). As one example, these control values can be determined during set up of the amplifier device 300 and then stored in the LUT(s). As other examples, these control values can be at various times determined during operation of the amplifier device 300. As one detailed example, the control values can be periodically updated at specific usage intervals or aperiodically in response to specific usage events. For example, the control values can be updated in response to changes in environment (e.g., temperature), changes in usage, or at different times of the day.

The amplifier devices described above (e.g., amplifier device 100, 300) can be implemented as a variety of different types of amplifiers. In one specific embodiment, such an amplifier device is implemented as a portion of a Doherty amplifier. In general, Doherty amplifiers divide an RF signal and use amplifiers biased to operate in different classes to amplify the divided parts of the RF signal.

Specifically, a Doherty amplifier typically includes a carrier amplifier and one or more peaking amplifiers, with the carrier amplifier used exclusively to amplify an input RF signal below a certain threshold, and the one or more peaking amplifiers used along with the carrier amplifier to amplify an input RF signal above that certain threshold. In a typical Doherty implementation, when the input RF signal is at relatively low signal levels, the carrier amplifier operates near its compression point and thus with high efficiency, while the peaking amplifier(s) are not operating. Thus, at relatively low signal levels the Doherty amplifier can provide both high efficiency and good linearity. Then, when higher signal levels occur, the carrier amplifier compresses, and one or more of the peaking amplifier(s) start to operate to "top up" the resulting output signal. Thus, the peaking amplifier(s) provide the ability to achieve high power output during times of high input signal levels. In such an implementation, the carrier amplifier can be operated as a class AB amplifier, and the peaking amplifier(s) are configured to operate as class C amplifiers.

Thus, the amplifiers of the Doherty amplifier together can provide relatively high power output and high efficiency. Stated another way, Doherty amplifiers thus can combine class AB and class C amplifiers in a way that maintains linearity while providing high power efficiency, and can further provide a high power output.

In an embodiment, the embodiments of amplifier devices previously described (e.g., amplifier device 100, 300) can be implemented as a peaking amplifier in a Doherty amplifier. As other embodiments, embodiments of multiple amplifier devices as previously described can be implemented a carrier amplifier and/or one or more peaking amplifiers. In each case the first amplifier (e.g., first amplifier 102, 302) can comprise one or more transistors (e.g., including a driver transistor and a final stage transistor, or just a final stage transistor). Thus, single stage (e.g., single transistor) carrier and peaking amplifiers can be used in some embodiments, and other embodiments can include multiple-stage amplifiers (e.g., in which each amplification path includes a driver transistor and a final-stage transistor coupled in series). In each case the various transistors can be implemented with gain bias modulation using a shaped envelope signal as described above.

Figure 4:
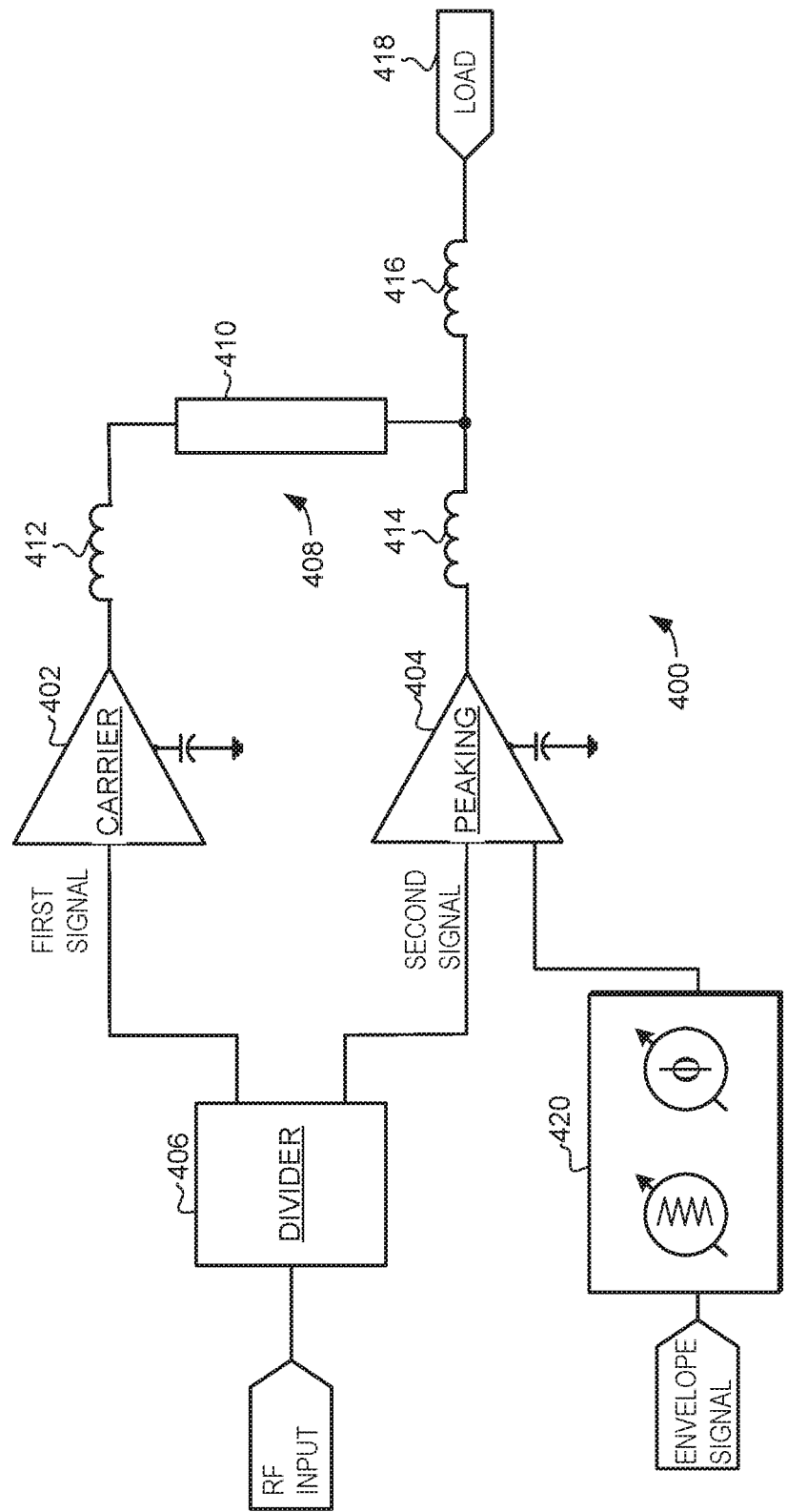
FIG. 4 is a circuit diagram of a portion of an exemplary Doherty amplifier in accordance with an example embodiment.

Turning now to FIG. 4, a schematic diagram representing a portion of an exemplary amplifier device 400 is illustrated. In this illustrated embodiment, the amplifier device 400 is a Doherty amplifier that receives an RF input signal and drives an amplified signal to a load 418 (e.g., an antenna). The amplifier device 400 includes a carrier amplifier 402, a peaking amplifier 404, a divider 406, and a combiner 408.

In general, the divider 406 receives an RF signal and generates two output signals that are 90 degrees out of phase with each other. These two output signals correspond to the first signal and second signal that are applied to the carrier amplifier 402 and peaking amplifier 404 respectively. The two output signals can be in the form of equal-power or unequal-power signals. The 90 degree phase difference can be provided by a phase delay element that applies a phase shift of about 90 degrees to the second signal before outputting the second signal to the peaking amplifier 404, for example. The 90 degree difference in phase allows the output of the peaking amplifier 404 to be in step with the carrier amplifier 402 output when combined by the combiner 408.

The amplifier device 400 receives and amplifies the first signal and the phase delayed second signal, combines the amplified first and second signals in phase, and drives the combined signal to a load 418 (e.g., an antenna). The carrier amplifier 402 includes one or more carrier transistors, and the peaking amplifier 404 includes one or more peaking transistors, and the outputs of the carrier and peaking transistors are coupled to combiner 408. Conceptually, the combiner 408 can be considered to include a ¼ wave transformer 410 and inductances 412 and 414. This combiner 408 serves to the combine the outputs of the carrier amplifier 402 and peaking amplifier 404 such that the combined output can be delivered to the load 418. To facilitate this, the combiner 408 is coupled to the load 418 through inductance 416. The ¼ wave transformer 410 of the combiner 408 provides a 90 degree phase shift to the output of the carrier amplifier 402 and thus facilitates the in-phase combining of that output signal from the carrier amplifier 402 with the output signal from the peaking amplifier 404. The combiner 408 also provides an impedance inversion between the outputs of the carrier amplifier 402 and the peaking amplifier 404. During operation, the impedance inversion effectively changes the impedance seen by the carrier amplifier 402 to provide an optimal load to the carrier amplifier 402 at and around the operational frequency of the amplifier 400. The inductances 412 and 414 in the combiner 408 can be provided by bond wire arrays used to couple the amplifiers 402 and 404 to a combining node (between inductances 414, 416).

In a typical embodiment, the carrier amplifier 402 and peaking amplifier 404 would be implemented with suitable RF-capable transistors with relatively high power capability. For example, the carrier amplifier 402 and peaking amplifier 404 can be implemented with high electron mobility transistors (HEMTs, such as Gallium Nitride (GaN) transistors), laterally diffused metal oxide semiconductor (LDMOS) transistors, or other suitable types of transistors.

In accordance with the embodiments described herein, the amplifier device 400 includes an envelope signal shaping device 420. The envelope signal shaping device 420 generates a shaped envelope signal that is outputted to peaking amplifier 404. Specifically, the shaped envelope signal is applied through a buffer (not shown in FIG. 4) to the gates of one or more transistors in the peaking amplifier 404. Thus, the shaped envelope signal is used for gate bias modulation in the peaking amplifier 404. For example, the envelope signal may be derived from the RF input signal, as previously discussed. In other embodiments, an envelope signal shaping device also or alternatively may be used to output a shaped envelope signal to carrier amplifier 402 in order to provide gate bias modulation in the carrier amplifier 402.

Figure 5:
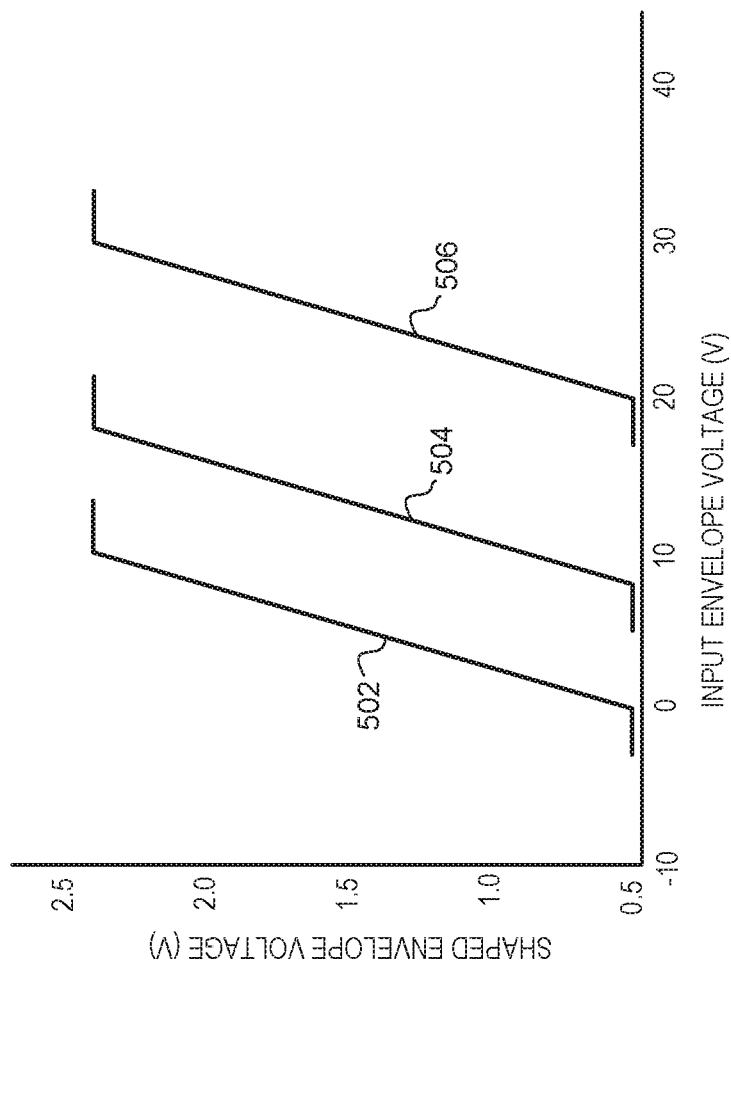
FIG. 5 is a graphical representation of shaping functions in accordance with an example embodiment.

Turning now to FIG. 5, a graphical representation 500 of exemplary shaping functions are illustrated. Specifically, FIG. 5 illustrates exemplary shaping functions 502, 504 and 506. Each of these shaping functions defines an exemplary relationship between the voltage of the envelope signal inputted to the signal shaping device (e.g., signal shaping device 104, 304, 420) and the voltage of the shaped envelope signal applied to a transistor gate for bias modulation. In this example, the three shaping functions are applied to different levels of envelope signal voltage.

In these illustrated examples, the shaping functions 502, 504 and 506 are piecewise linear functions. Of course, these are just one example and other functions can be implemented. For example, S-shaped functions can be implemented.

In one embodiment, an apparatus is provided, the apparatus comprising: an envelope signal generator, the envelope signal generator configured to receive a radio frequency (RF) signal and generate an envelope signal corresponding to the RF signal; a first amplifier, the first amplifier including at least a first transistor, the first transistor including a first gate configured to receive the RF signal; and a signal shaping device, the signal shaping device configured to selectively shape the envelope signal and apply the selectively shaped envelope signal to the first gate to modulate a bias applied to the first gate.

In another embodiment an apparatus is provided, the apparatus comprising: an envelope signal generator, the envelope signal generator configured to receive a radio frequency (RF) signal and generate an envelope signal corresponding to the RF signal; an envelope signal attenuator, the envelope signal attenuator configured to selectively attenuate the envelope signal; an envelope signal phase shifter, the envelope signal phase shifter configured to selectively phase shift the envelope signal; an RF signal attenuator, the RF signal attenuator configured to selectively attenuate the RF signal; an RF signal phase shifter, the RF signal phase shifter configured to selectively phase shift the RF signal; and a first amplifier, the first amplifier including at least a first transistor, the first transistor including a first gate configured to receive the selectively attenuated and selectively phase shifted RF signal, wherein the envelope signal attenuator, the envelope signal phase shifter, the RF signal attenuator and the RF signal phase shifter are digitally controlled.

Various modifications may be made to the above-described and illustrated embodiments without departing from the scope of the inventive subject matter. For example, although conventional Doherty amplifier implementations are discussed above (e.g., in which a 90 degree phase delay is applied to the input peaking signal prior to amplification, and a corresponding 90 degree phase delay is applied to the output carrier signal after amplification to ensure that the amplified carrier and peaking signals are combined in phase), other embodiments may include an "inverted" Doherty amplifier implementation (e.g., in which a 90 degree phase delay is applied to the input carrier signal prior to amplification, and a corresponding 90 degree phase delay is applied to the output peaking signal after amplification). Further, as mentioned above, embodiments include single-stage and multiple-stage amplifiers. Also, the main and peaking transistors may be implemented on separate die or on the same die, in various embodiments.

The preceding detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, or the following detailed description.

Furthermore the connecting lines shown in the various figures contained herein are intended to represent exemplary functional relationships and/or physical couplings between the various elements. It should be noted that many alternative or additional functional relationships or physical connections may be present in an embodiment of the subject matter. In addition, certain terminology may also be used herein for the purpose of reference only, and thus are not intended to be limiting, and the terms "first", "second" and other such numerical terms referring to structures do not imply a sequence or order unless clearly indicated by the context.

As used herein, a "node" means any internal or external reference point, connection point, junction, signal line, conductive element, or the like, at which a given signal, logic level, voltage, data pattern, current, or quantity is present. Furthermore, two or more nodes may be realized by one physical element (and two or more signals can be multiplexed, modulated, or otherwise distinguished even though received or output at a common node).

The foregoing description refers to elements or nodes or features being "connected" or "coupled" together. As used herein, unless expressly stated otherwise, "connected" means that one element is directly joined to (or directly communicates with) another element, and not necessarily mechanically. Likewise, unless expressly stated otherwise, "coupled" means that one element is directly or indirectly joined to (or directly or indirectly communicates with, electrically or otherwise) another element, and not necessarily mechanically. Thus, although the schematics shown in the figures depict several exemplary arrangements of elements, additional intervening elements, devices, features, or components may be present in other embodiments of the depicted subject matter.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:

1. An apparatus comprising:
    an envelope signal generator, the envelope signal generator configured to receive a radio frequency (RF) signal and generate an envelope signal corresponding to the RF signal;
    a first amplifier, the first amplifier including at least a first transistor, the first transistor including a first gate configured to receive the RF signal;
    a signal shaping device, the signal shaping device configured to selectively shape the envelope signal and apply the selectively shaped envelope signal to the first gate to modulate a bias applied to the first gate; and
    an RF signal attenuator, the RF signal attenuator configured to selectively attenuate the RF signal prior to the RF signal being received at the first gate.

2. The apparatus of claim 1, wherein the signal shaping device includes an envelope signal attenuator, the envelope signal attenuator configured to selectively attenuate the envelope signal.

3. The apparatus of claim 2, wherein the signal shaping device further comprises an envelope signal phase shifter, the envelope signal phase shifter configured to selectively phase shift the envelope signal such that envelope signal is additionally phase shifted when applied at the first gate.

4. The apparatus of claim 2, wherein the envelope signal attenuator is configured to attenuate the envelope signal at a first attenuation level when the envelope signal has an amplitude that is below a first threshold and to attenuate the envelope signal to a second attenuation level when the envelope signal has an amplitude that is above the first threshold, where the second attenuation level is greater than the first attenuation level.

5. The apparatus of claim 2, wherein the envelope signal attenuator comprises a plurality of switched resistors.

6. The apparatus of claim 2, wherein the envelope signal attenuator is configured to be digitally controlled.

7. The apparatus of claim 6, wherein the envelope signal attenuator is configured to be digitally controlled based on control values stored in a look up table (LUT).

8. The apparatus of claim 7, wherein the control values are determined during set up of the amplifier.

9. The apparatus of claim 1, wherein the signal shaping device implements a piecewise linear function to selectively shape the envelope signal.

10. The apparatus of claim 1, further comprising a buffer amplifier, the buffer amplifier coupled between the signal shaping device and the first gate.

11. The apparatus of claim 1 further comprising an RF signal phase shifter, the RF signal phase shifter configured to selectively phase shift the RF signal prior to the RF signal being received at the first gate.

12. The amplifier of claim 1, wherein the envelope signal generator comprises a digital signal processor (DSP).

13. The apparatus of claim 1, wherein the apparatus comprises a Doherty amplifier, and wherein the first amplifier is implemented as a peaking amplifier in the Doherty amplifier, and wherein the Doherty amplifier further comprises a carrier amplifier.

14. An apparatus comprising:
an envelope signal generator, the envelope signal generator configured to receive a radio frequency (RF) signal and generate an envelope signal corresponding to the RF signal;
an envelope signal attenuator, the envelope signal attenuator configured to selectively attenuate the envelope signal;
an envelope signal phase shifter, the envelope signal phase shifter configured to selectively phase shift the envelope signal;
an RF signal attenuator, the RF signal attenuator configured to selectively attenuate the RF signal;
an RF signal phase shifter, the RF signal phase shifter configured to selectively phase shift the RF signal;
a first amplifier, the first amplifier including at least a first transistor, the first transistor including a first gate configured to receive the selectively attenuated and selectively phase shifted RF signal; and
wherein the envelope signal attenuator, the envelope signal phase shifter, the RF signal attenuator and the RF signal phase shifter are digitally controlled.

15. The apparatus of claim 14, wherein the envelope signal attenuator, the envelope signal phase shifter, the RF signal attenuator and the RF signal phase shifter are digitally controlled based on control values stored in a look up table (LUT).

16. The apparatus of claim 15, wherein the control values are determined during set up of the amplifier.

17. The apparatus of claim 14, further comprising a buffer amplifier, the buffer amplifier coupled between the envelope signal attenuator and the first gate.

18. The apparatus of claim 14, wherein the envelope signal attenuator is configured to attenuate the envelope signal at a first attenuation level when the envelope signal has an amplitude that is below a first threshold and to attenuate the envelope signal to a second attenuation level when the envelope signal has an amplitude that is above the first threshold, where the second attenuation level is greater than the first attenuation level; and
wherein the RF signal attenuator is configured to attenuate the RF signal at a third attenuation level when the RF signal has an amplitude that is below a second threshold and to attenuate the RF signal to a fourth attenuation level when the RF signal has an amplitude that is above the second threshold, where the fourth attenuation level is greater than the third attenuation level.

19. The apparatus of claim 14, wherein the first amplifier, the envelope signal attenuator, the envelope signal phase shifter, the RF signal attenuator and the RF signal phase shifter are all encased in together in a device package.

20. An apparatus comprising:
an envelope signal generator, the envelope signal generator configured to receive a radio frequency (RF) signal and generate an envelope signal corresponding to the RF signal;
a first amplifier, the first amplifier including at least a first transistor, the first transistor including a first gate configured to receive the RF signal;
a signal shaping device, the signal shaping device configured to selectively shape the envelope signal and apply the selectively shaped envelope signal to the first gate to modulate a bias applied to the first gate;
wherein the signal shaping device includes an envelope signal attenuator, the envelope signal attenuator configured to selectively attenuate the envelope signal, and wherein the envelope signal attenuator is configured to be digitally controlled, and wherein the envelope signal attenuator is configured to be digitally controlled based on control values stored in a look up table (LUT).

* * * * *